United States Patent
Kasibhatla et al.

(10) Patent No.: US 11,223,351 B1
(45) Date of Patent: Jan. 11, 2022

(54) ACTIVITY-AWARE CLOCK GATING FOR SWITCHES

(71) Applicant: XILINX, INC., San Jose, CA (US)

(72) Inventors: Amarnath Kasibhatla, San Jose, CA (US); Saurabh Mathur, Saratoga, CA (US); Mansi Shrikant Patwardhan, San Jose, CA (US); Tim Tuan, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/163,189

(22) Filed: Jan. 29, 2021

(51) Int. Cl.
*H03K 17/28* (2006.01)
*G06F 1/04* (2006.01)
*H03K 17/00* (2006.01)

(52) U.S. Cl.
CPC .............. *H03K 17/28* (2013.01); *G06F 1/04* (2013.01); *H03K 17/002* (2013.01)

(58) Field of Classification Search
CPC ........................... H02K 17/28; H02K 17/284
See application file for complete search history.

(56) References Cited

U.S. PATENT DOCUMENTS

| | | | |
|---|---|---|---|
| 7,746,111 B1 | 6/2010 | Gaide et al. | |
| 7,746,116 B1 | 6/2010 | Narayanan et al. | |
| 7,750,680 B2* | 7/2010 | Mamidipaka | H03K 19/0016 326/93 |
| 7,902,878 B2* | 3/2011 | Saint-Laurent | H03K 19/0016 326/98 |

* cited by examiner

*Primary Examiner* — Hai L Nguyen
(74) *Attorney, Agent, or Firm* — Patterson + Sheridan, LLP

(57) ABSTRACT

A switch with clock-gating control and a method for clock gating a switch are described herein. In one example, the method generally includes detecting a state of one or more input ports and a state of one or more output ports of the switch, determining whether the state of the one or more input ports and the state of the one or more output ports has been stable for a preset number of clock cycles, and gating the switch from a clock signal until the state of the one or more input ports or the state of the one or more output ports change upon determining the states have been stable for the preset number of the cycles.

20 Claims, 7 Drawing Sheets

ACTIVITY-AWARE CLOCK GATING FOR SWITCHES

TECHNICAL FIELD

Examples of the present disclosure generally relate to clock gating and, in particular, to activity-aware clock gating for switches.

BACKGROUND

Clock switching power typically amounts to more than 50% of the full operational power consumption of modern application specific integrated circuits (ASICs) and clock gating is one of the major go-to techniques for dynamic power reduction in synchronous ASIC designs. Clock gating is achieved by driving a constant logical 0 or 1 value on the clock input signal of sequential integrated circuit (IC) components, for which a clock is not needed during certain periods of operation.

A common technique is to gate clocks to IC components when an on-chip global power management unit deems those IC components as functionally not necessary to the applications running. However, such a technique does not help save power when an IC component is in full operational mode. A more leaf level clock gating approach relies on the fact that IC components will be updated only when the input capture enable condition (i.e., a condition referred to as the enable condition) is met. Hence, those IC components do not need their input clock toggled when the enable condition is a logical 0.

Conventional techniques exploit this power saving opportunity by enabling synthesis tools to infer clock gating standard IC components on the clock path of sequential IC components. These clock gating IC components receive as inputs the clock and the enable signal and generate, as an output, a gated clock which is driven to the sequential IC components. Such techniques work well for sequential IC components that naturally have enable signals for other IC components (e.g., data path elements, FIFO (first in, first out) data arrays). However, control path sequential IC components, which constantly need to serve logic events, do not have enable signals and hence cannot be clock gated via inferring clock gate cells. Such control path sequential IC components can still make up for a significant portion of the total dynamic power in logic modules like switches/routers.

SUMMARY

A switch with clock-gating control and a method for clock gating a switch are described herein. In one example, the method generally includes detecting a state of one or more input ports and a state of one or more output ports of the switch, determining whether the state of the one or more input ports and the state of the one or more output ports has been stable for a preset number of clock cycles, and gating the switch from a clock signal until the state of the one or more input ports or the state of the one or more output ports change upon determining the states have been stable for the preset number of the cycles.

In another example, a switch with clock-gating control is provided that includes a switch and clock-gating logic. The switch includes one or more input ports and one or more output ports. The clock-gating logic is configured to detect a state of one or more input ports and a state of one or more output ports of the switch; determine whether the state of the one or more input ports and the state of the one or more output ports has been stable for a preset number of clock cycles; and upon determining the states have been stable for the preset number of clock cycles, gate the switch from a clock signal until the state of the one or more input ports or the state of the one or more output ports changes.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

Figure 1:
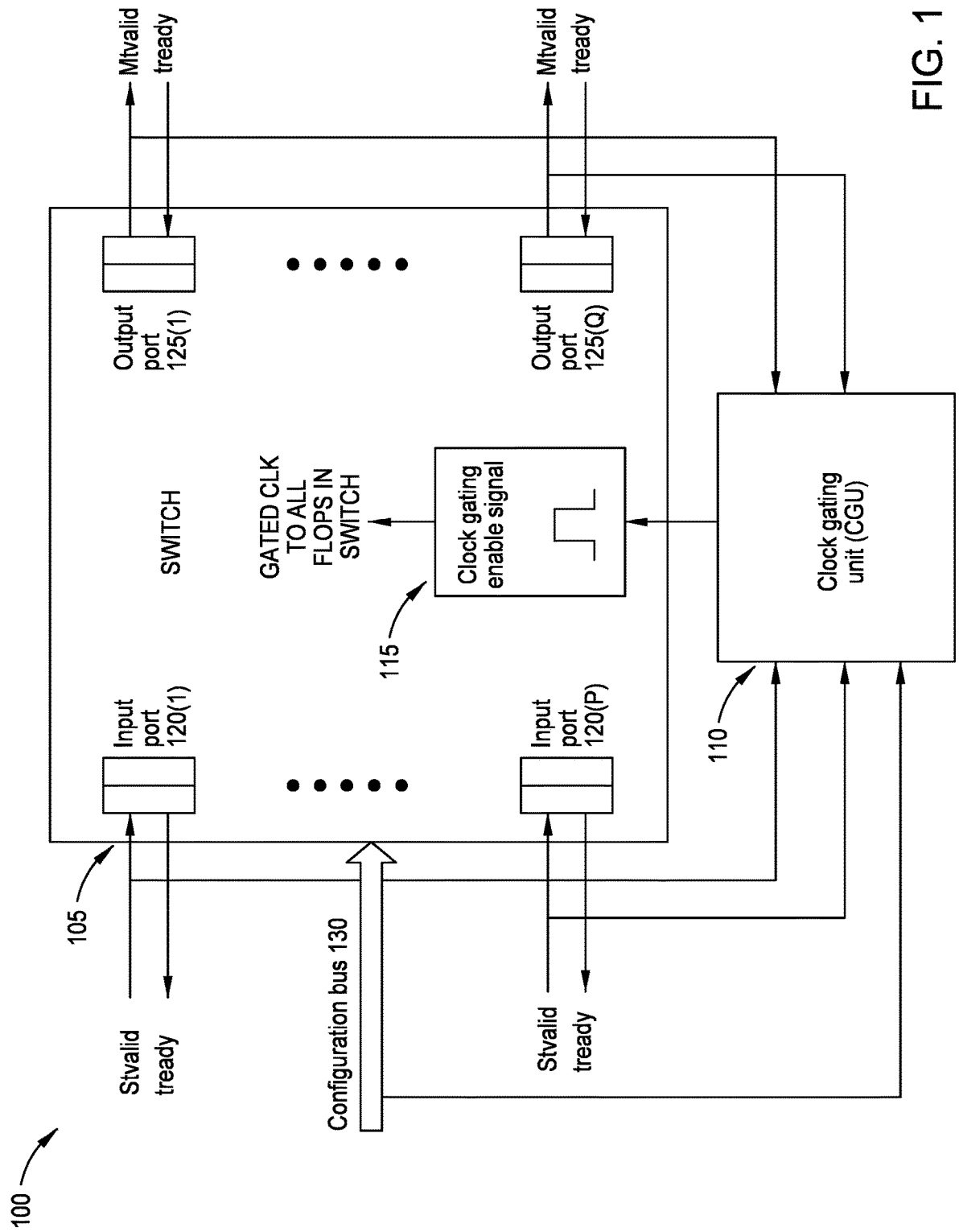
FIG. 1 illustrates a switch with a clock gating unit (CGU), according to one example.

To facilitate understanding, identical reference numerals have been used, where possible, to designate identical elements that are common to the figures. It is contemplated that elements of one example may be beneficially incorporated in other examples. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

DETAILED DESCRIPTION

Examples disclosed herein provide activity-aware clock gating techniques to clock gate switches by adaptively identifying windows of local idleness. Identifying windows of local idleness enables clock gating control path sequential IC components (e.g., switches). Using the activity-aware clock gating techniques achieves significant dynamic power savings over conventional clock gating. For some systems, measured power savings range from 5-10 W, depending on operating voltage and frequency.

The activity-aware clock gating technique can be applied to partial or full crossbar switches in either circuit or packet switching configurations since the activity-aware clock gating is performed solely based on monitoring the input and output ports of the switch. As described herein, activity-aware clock gating techniques relate to methods for clock-gating switches with clock-gating control. The method involves detecting a state of one or more input ports and a state of one or more output ports of the switch and determining whether the state of the input ports and the state of the output ports have been stable for a preset number of clock cycles. Upon determining the states have been stable for the preset number of clock cycles, the method further involves gating the switch from a clock signal until the state of the input ports or the state of the output ports changes.

FIG. 1 illustrates a switch 105 coupled to a clock gating unit (CGU) 110. Many systems incorporate switches, which are logic modules that dynamically route data or control packet streams from P number of producers (i.e., sources of data) to Q number of consumers (i.e., destinations of data, such as a central processing unit core, direct memory access interface, network on chip interface). The switch 105 may be a stream switch or other type of switch that can clock-gate using the CGU 110. In some examples, the switch may be a partial or a full crossbar switch in circuit or packet switching configurations.

The switch 105 has input ports 120(1)-120(P) (collectively input ports 120) designated as secondary ports (i.e., receivers of transactions) and output ports 125(1)-120(Q) designated as primary ports (i.e., drivers of transactions). The switch 105 can have any number of input ports 120 (indicated by P), which may be coupled to P producers of data, and reference to a single input port 120 may refer to any of the input ports 120. The switch 105 can have any number of output ports 125 (indicated by Q), which may be coupled to Q consumers of data, and reference to a single output port 125 may refer to any of the output ports 125. Routing of a transaction from a certain input port 120 to a certain output port 125 is determined by the switch's 105 configuration programmed via a configuration bus 130. Each input port 120 and each output port 125 has a valid indicator (e.g., Stvalid, Mtvalid) and a ready indicator (e.g., tready). The valid indicator on an output port 125 indicates the port has data ready to transfer when value of the valid indicator changes from logically 0 (e.g., deasserted) to logically 1 (e.g., asserted). The valid indicator on an input port 120 indicates that a producer has data available to be consumed by the input port. The ready indicator, when asserted by an input port 120, indicates whether the input port 120 is ready to accept an incoming transaction. The ready indicator to an output port tells the output port whether the output port's recipient is ready to accept a transaction. For example, when the input port 120 has space to accept incoming data it changes the value of the ready indicator from logical 0 to logical 1. The valid indicator can be an input to the input port 120, and the ready indicator can be an input to the output port 125.

In one example, transactions are in terms of packets and the number of words transferred in a packet and can be of variable length. The input port 120 can implement a ready valid data transfer protocol (e.g., Advanced eXtensible Interface (AXI) ready valid data transfer handshake) to consume each word of a packet. Similarly, the output port 125 can implement such a ready valid data transfer protocol to generate output words of a packet. Without loss of generality, the ready valid data transfer protocol can be used with the activity-aware clock gating. The activity-aware clock gating can be applied to any switch that implements any similar data word transfer mechanisms at the input and output ports regardless of the implementation details inside the switch.

In some examples, the switch 105 comprises a configuration bus 130 that receives configuration information used for configuring the switch 105. As with the input ports 120 and the output ports 125, the switch 105 includes a valid indicator and ready indicator for indicating the status of the configuration bus 130.

As mentioned above, FIG. 1 includes the CGU 110 coupled to the switch 105 that is to be clock gated. The CGU 110 may be hardware, such as circuitry and/or programmable logic that is coupled to the switch 105, and is configured to control and manage the gating of clock signals communicated to the switch 105 based on the activity of the switch 105. The CGU 110 is coupled to each of the input ports 120, the output ports 125, and the configuration bus 130. The CGU 110 monitors the input ports 120, output ports 125, configuration bus 130, and their respective ready and valid indicators. Based on windows of idleness of the input ports 120, output ports 125, and the configuration bus 130, the CGU 110 sends the clock gating enable signal 115 to the switch 105, thereby clock gating the switch 105. In some examples, the CGU 110 is coupled to the ready indicators and/or valid indicators of the input ports 120, the output ports 125, and the configuration bus 130 to facilitate the monitoring of the input ports 120, the output ports 125, and the configuration bus 130.

In one embodiment, activity-aware clock gating involves clock gating the switch 105 when the switch 105 experiences a lack of transfer activity on all input ports 120 and all output ports 125. The lack of transfer activity on all input ports 120 and all output ports 125 is also referred herein as a "window of idleness". Accordingly, the CGU 110 monitors the input ports 120, the output ports 125, and the configuration bus 130 for windows of idleness. During the windows of idleness, the switch 105 exhibits the condition to enter sleep mode: the valid indicator for all input ports 120 is logically 0 and the valid indicator for all the output ports 125 is logically 0. Similarly, the valid indicator for the configuration bus 130 is logically 0. Because the valid indicator for the input ports 120, the output ports 125, and the configuration bus 130 indicate no valid data received or to send, the CGU 110 is aware that there is a lack of transfer activity and there is a window of idleness during which the switch 105 can be clock gated. When the CGU 110 asserts the clock gating enable signal 115, the CGU 110 asserts the clock gating enable signal 115 to the switch 105 and gates the clock signal to all circuitry requiring a clock signal in the switch 105. Accordingly, the switch 105 enters sleep mode from active mode until the switch 105 experiences transfer activity.

Clock gating ends when the window of idleness ends. Specifically, clock gating ends when the condition for the switch 105 to exit from sleep mode to active mode is satisfied: the value of any of the valid indicators for the input ports 120, the valid indicators for the configuration bus 130, or the valid indicators of the output ports 125 changes from logical 0 to logical 1. When the window of idleness ends, the CGU 110 detects that the condition to enter (and stay in) sleep mode has changed, and thus after a clock cycle of latency, disables the clock gating enable signal 115 and stops clock gating the switch 105. When the condition to exit from sleep mode to active mode is satisfied, the CGU 110 detects that the switch 105 is experiencing transfer activity and needs a clock signal to operate the circuitry inside the switch 105 that requires clock signals.

During regular operation of the switch 105, the CGU 110 can detect the conditions to enter sleep mode and to exit sleep mode that naturally occurs when the switch experiences transfer activity. However, the conditions may cause excessive thrashing between active and sleep modes when the CGU 110 enables and disables the clock gating enable signal 115 based on the conditions to enter or exit sleep mode and the condition to enter or exit sleep mode during regular transfer activity of the switch 105. In some examples, to prevent excessive thrashing between active and sleep modes, the CGU 110 clock gates the switch 105 after observing the condition to enter sleep mode for a preset number (N) of clock cycles. Observing the condition to enter sleep mode for an N clock cycles indicates that there is a stable signal to each of the input ports 120, output ports 125, and configuration bus 130, which means that there is a steady lack of transfer activity. This preset number N is available as a configurable threshold in order to flexibly choose how aggressively sleep mode can be entered. In some examples, the CGU 110 can include a threshold register for storing the preset number N of clock cycles. If the condition to enter sleep mode is not satisfied before the preset number N of clock cycles lapses, then the CGU 110 aborts sleep mode entry and aborts clock gating. The switch 105 can incur one clock cycle latency when transitioning from sleep mode to active mode because the CGU 110 needs a clock cycle to disable the clock gating enable signal 115.

In some examples, as described in further detail with reference to FIG. 2, the CGU 110 implements activity-aware clock gating as follows: (1) the CGU 110 observes the condition to enter sleep mode for N clock cycles; (2) the ready indicator at the input port 120 is driven to logical 0; (3) the CGU 110 gates the clock signal to the switch 105, and the switch 105 enters sleep mode; (4) the CGU 110 observes the condition to exit sleep mode and stops clock gating the switch 105; and (5) the ready indicator of the input port 120 is driven to logical 1 the next clock cycle.

As mentioned above, the switch 105 can experience a window of idleness for any number of clock cycles during which no data transfers happen on all its input and output ports due to at least one or both of backpressure or no-data conditions on the input ports 120 and/or output ports 125. During normal ASIC operations, producer and consumers tend to work in bursts. A producer creates information and sends the information as a burst of transactions and the consumer consumes the burst and works on that information for a period of time. Accordingly, such bursts and corresponding consumption creates a no-data scenario in which once the burst transfer through the switch 105 is complete, the switch 105 has no more data transfer activity at the input port 120 until the producer generates the next data burst. In such no-data scenarios, the valid indicator of the input ports 120 is logically 0 and thus, eventually the valid indicator of the output ports 125 is logically 0. Similarly, a backpressure scenario can occur where a producer has packets to transfer but the consumer is still working on the previous data and is not ready to accept a new burst of data. Accordingly, a backpressure of data builds because the ready indicator of the output port 125 is logically 0, which eventually propagates back to its corresponding input port 120 because the switch 105 has finite storing capacity in its internal queues and thus results in the ready indicator of the input port 120 becoming logically 0.

In either a no-data scenario or a back-pressure scenario, the switch 105 can be clock gated during the window of idleness even if there are words in the internal storage queues of the switch 105.

Figure 2:
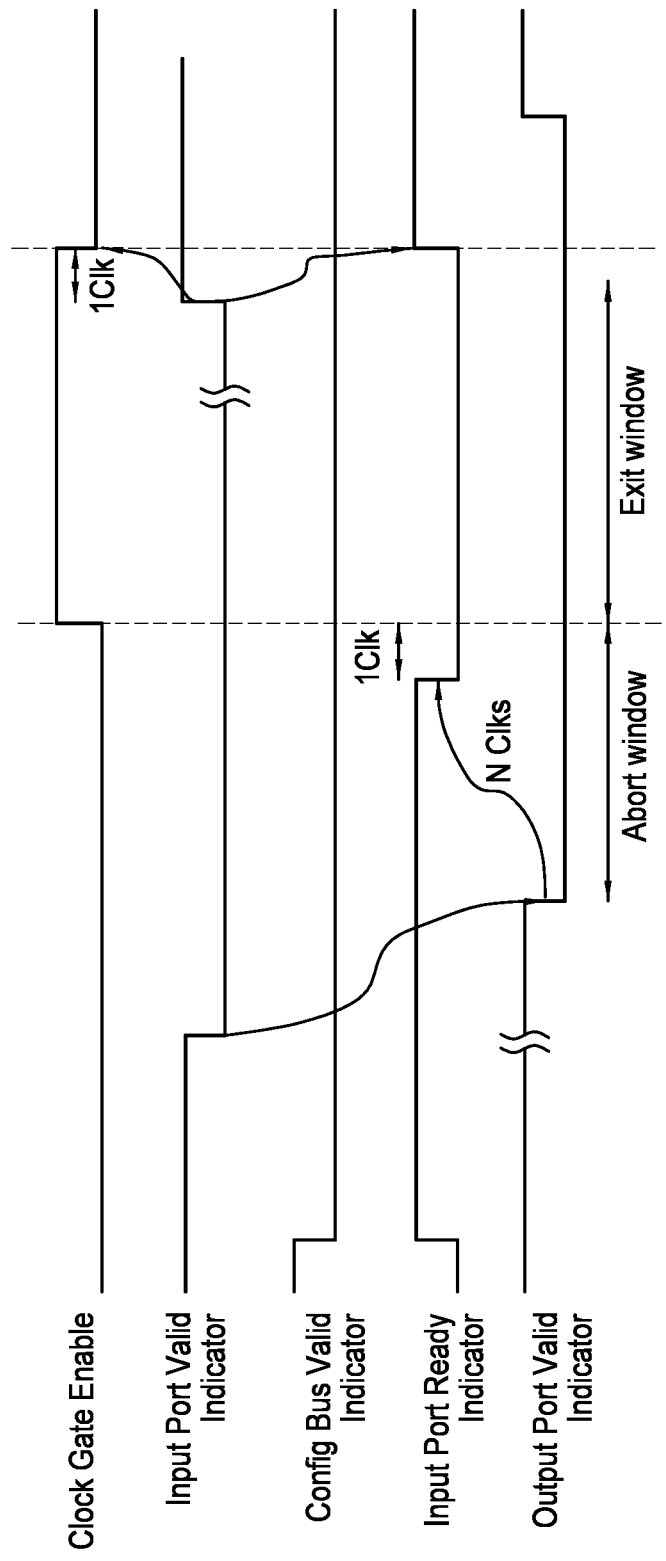
FIG. 2 illustrates timing diagrams for a switch with the CGU, according to one example.
Figure 3:
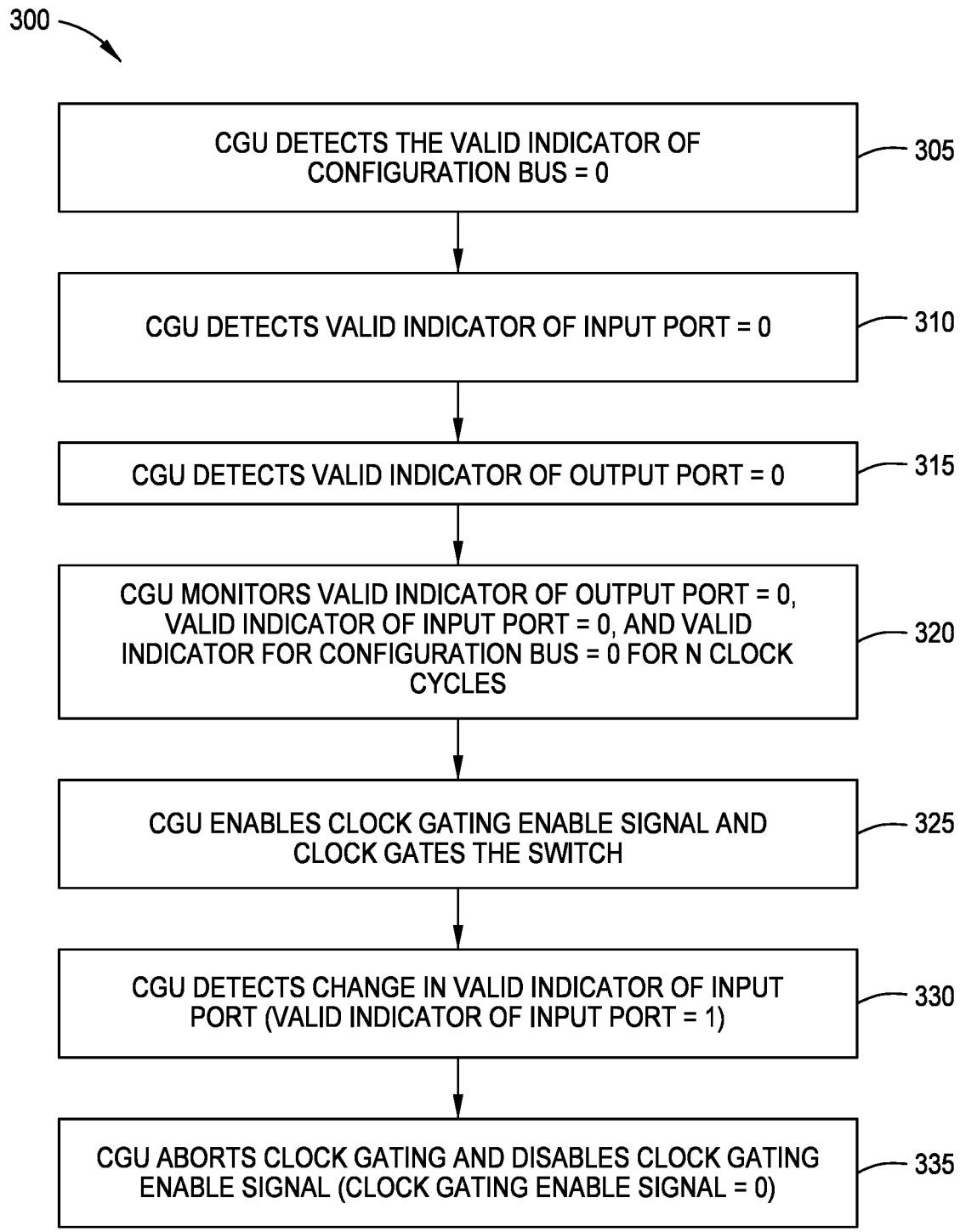
FIG. 3 is a flow diagram illustrating operations by the CGU, according to the timing diagram of FIG. 2, according to one example.

FIG. 2 and FIG. 3 illustrate operations by the CGU 110, according to one example. Specifically, FIG. 2 illustrates a timing diagram for clock-gating under a no-data scenario, and FIG. 3 is a flow diagram illustrating operations of a method 300 for clock-gating a switch 105 by the CGU 110 according to the timing diagram of FIG. 2.

As illustrated, at operation 305, the CGU 110 detects a lack of transfer activity when the valid indicator of the configuration bus 130 is logically 0. Specifically, the CGU 110 detects that the configuration bus 130 has no valid data to transfer (i.e., no transfer activity on the configuration bus 130) when the valid indicator of the configuration bus 130 is logically 0. At operation 310, the CGU 110 detects that the input port 120 has no valid data to transfer when the valid indicator of the input port 120 is driven from logically 1 to logically 0. In some cases, the CGU 110 does not need to monitor the ready indicator of the input port 120, and the CGU 110 monitors the valid indicator of the input port 120. At operation 315, the CGU 110 detects that the output port has no valid data to any other IC component when the valid indicator of the output port 125 has been driven from logically 1 to logically 0.

At operation 315, the CGU 110 detects the change in the values of the indicators of the input ports 120 and in the values of the indicators of the output ports 125. Also at operation 315, the CGU 110 determines that the condition for the switch 105 to enter sleep mode has been satisfied (i.e., the valid indicator for all input ports 120 is logically 0, the valid indicator for all the output ports 125 is logically 0, and the valid indicator for the configuration bus 130 is logically 0) and that there is a window of idleness. At operation 320, the CGU 110 monitors the state of the input ports 120, the output ports 125, and the configuration bus 130 to ensure that the condition for the switch 105 to enter sleep mode does not change during the abort window 205. The abort window 205 is the time period from when the CGU 110 detects that the condition for the switch 105 to enter sleep mode has been satisfied until the clock gate enable signal 115 is driven to logical 1. The abort window 205 is also the time period during which any incoming or outgoing data prevents the CGU 110 from clock gating the switch 105. As illustrated in FIG. 2, the abort window 205 lasts N+1 clock cycles because the condition to enter sleep mode needs to stay satisfied for N clock cycles and the CGU 110 needs an additional clock cycle to enable clock gating (via the clock gate enable signal 115 going from logical 0 to logical 1).

After N clock cycles, the ready indicator of the input port 120 falls from logically 1 to logically 0, which prompts, at operation 325, the CGU 110 to change the clock gating enable signal 115 from logical 0 to logical 1 during the following clock cycle. When the clock gate enable signal 115 goes from logical 0 to 1, the abort window 205 ends and the exit window 210 begins. The exit window 210 is the time period when the clock gate enable signal is logically 1, and is also the time period during which the CGU 110 is clock gating the switch 105.

At some point during the exit window 210, at operation 330, the CGU 110 detects that the valid indicator of the input port 120 has changed from logical 0 to logical 1. As mentioned previously, when any one of the valid indicators of the input ports 120, the valid indicator of the configuration bus 130, or the valid indicators of the output ports 125 changes from values, the CGU 110 detects that the window of idleness has ended or is ending. Accordingly, at operation 335, the CGU 110 stops clock gating the switch 105 and disables the clock gating enable signal 115. As illustrated in FIG. 2, when the valid indicator of the input port 120 changed value from logical 0 to logical 1, the CGU stopped clock gating the switch 105 and changed the value of the clock gating enable signal from logical 1 to logical 0.

However, in this example, there is one clock cycle of latency between the valid indicator of the input port 120 becoming logically 1 and the clock gating enable signal 115 becoming logically 0. There is also one clock cycle of latency between the valid indicator of the input port 120 becoming logically 1 and the ready indicator of the input port 120 becoming logically 1.

Figure 4:
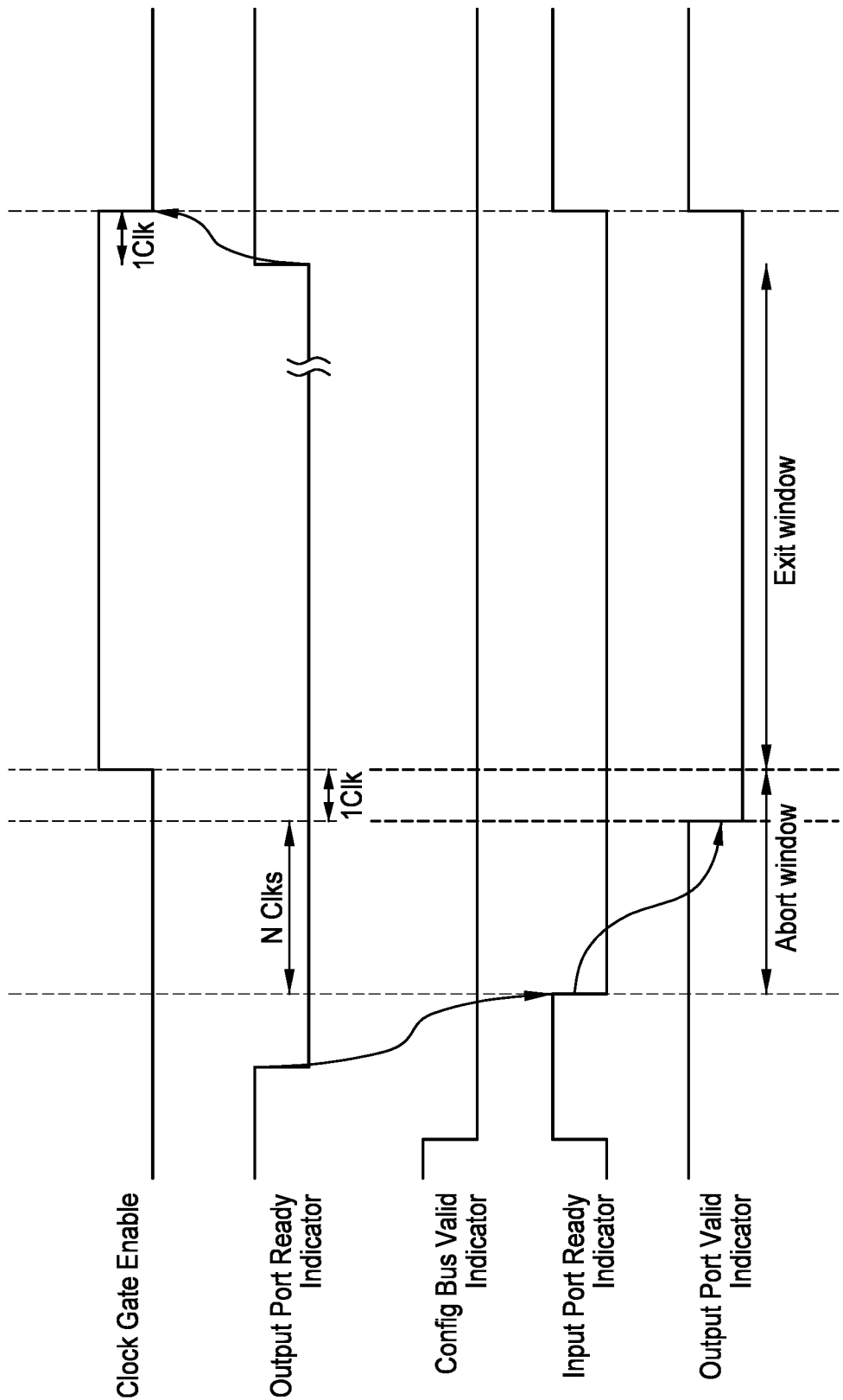
FIG. 4 illustrates timing diagrams for a switch with the CGU, according to one example.
Figure 5:
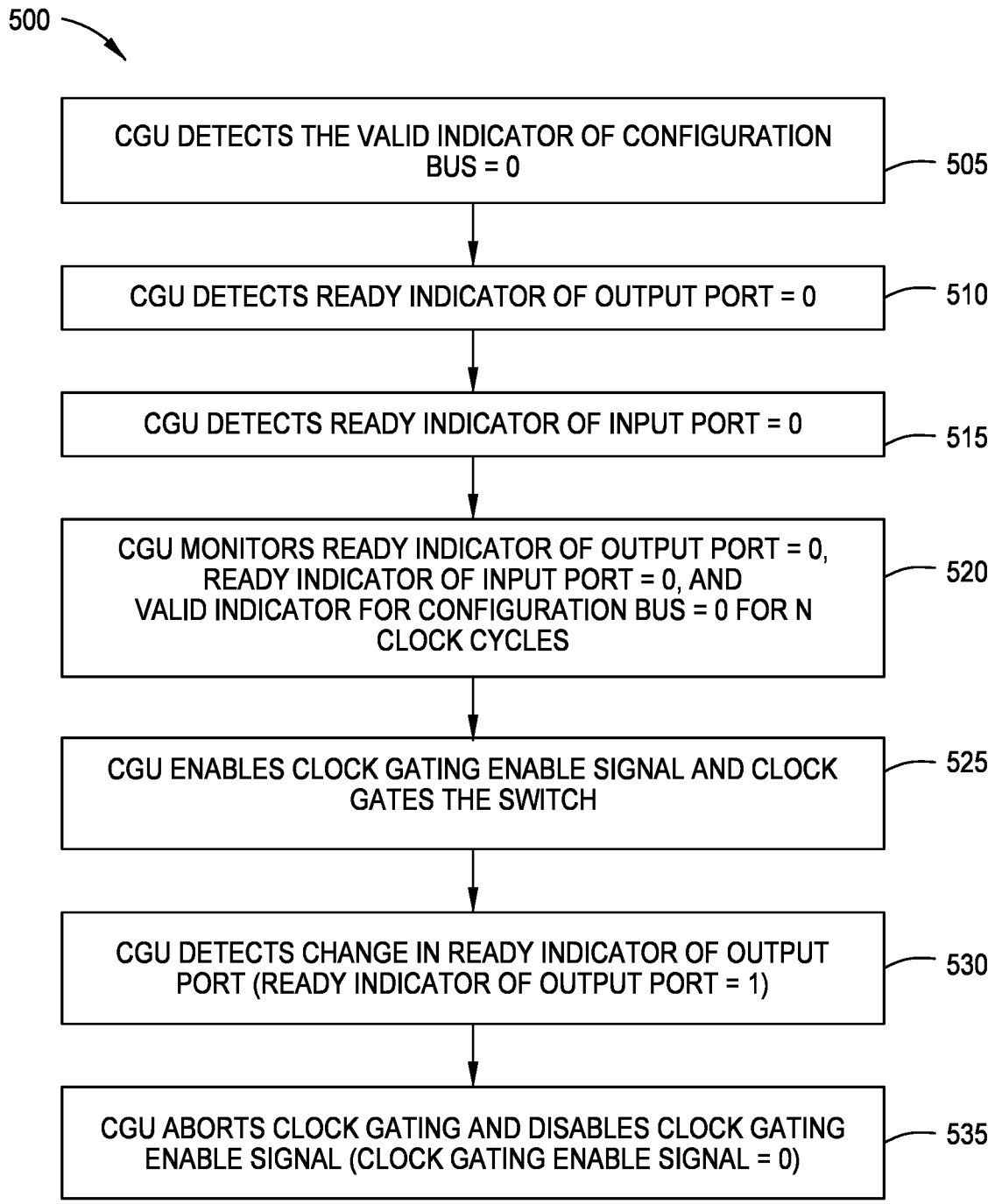
FIG. 5 is a flow diagram illustrating operations by the CGU according to the timing diagram of FIG. 4, according to one example.

FIGS. 4 and 5 illustrates operations by the CGU 110, according to one example. Specifically, FIG. 4 illustrates a timing diagram for clock gating under a back pressure scenario and FIG. 5 is a flow diagram of operations of a method 500 for clock-gating a switch 105 by the CGU 110 according to the timing diagram of FIG. 4.

In a backpressure scenario, the CGU 110 detects the condition for the switch 105 to enter sleep mode when the valid indicator of the configuration bus 130 is logically 0 at operation 505 and when the ready indicator of the output ports 125 becomes logical 0 at operation 510. As illustrated, at this point, the ready indicator of the output ports 125 is logical 0 although the valid indicator of the output ports 125 may still be logical 1. In the backpressure scenario, the valid indicator of the input ports 120 may be logically 1 but once the ready indicator of the input ports 120 becomes 0 at operation 515, the abort window 205 begins at operation 520 during which the CGU 110 monitors the states of the input ports 120, output ports 125, and the configuration bus 130. The CGU may not abort the process so long as either the valid indicator or the ready indicator of the input ports 120 is logically 0, and as long as either the valid indicator or the ready indicator of the output ports 125 is logically 0 during the N clock cycles. After N clock cycles, at operation 525, the CGU 110, accordingly, after a clock cycle of latency, enables the clock gating enable signal 115 and begins clock gating the switch 105.

At some point during the exit window 210 at operation 530, the CGU 110 detects that the ready indicator of the output ports 125 has become logically 1 and indicates to both the switch 105 and the CGU 110 that data is ready to be transmitted from the output ports 125. Accordingly, after a clock cycle of latency for transitioning the switch 105 from sleep mode to active mode (i.e., because the CGU 110 needs a clock cycle to disable the clock gating enable signal 115), the CGU 110 aborts clock gating at operation 535 by changing the clock gating enable signal 115 from logical 1 to logical 0. One clock cycle after the clock gating enable signal 115 goes to logical 0, the ready indicator of the input port 120 is asserted and becomes logical 1. Similarly, one clock cycle after the clock gating enable signal 115 goes to logical 0, the valid indicator of the output port 125 becomes logical 1.

Because of the no-data scenario and the backpressure scenarios, activity-aware clock gating can also include clock gating the switch 105 using different conditions to enter sleep mode in order for the switch 105 to enter sleep mode in either the no-data scenario or the backpressure scenario. Accordingly, the CGU 110 can clock gate the switch 105 when the following conditions are satisfied: (1) each of the input ports have either its ready indicator as logical 0 or its valid indicator as logical 0; (2) each of the output ports have either its ready indicator as logical 0 or its valid indicator as logical 0; and (3) the valid indicator for the configuration bus 130 is logically 0.

Figure 6:
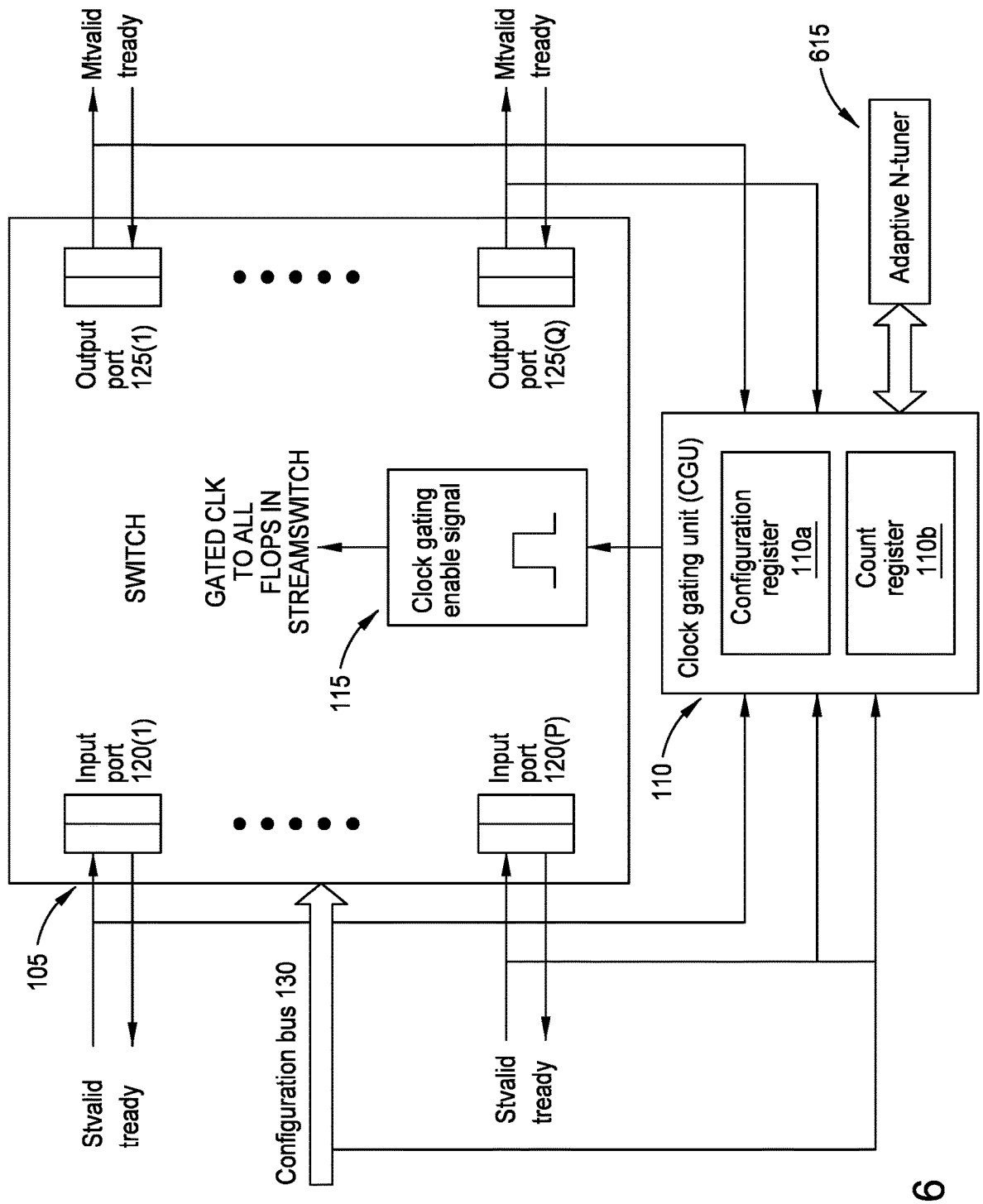
FIG. 6 illustrates a switch with the CGU and an adaptive tuner, according to one example.

FIG. 6 illustrates a switch 105 with a clock gating unit 110 of FIG. 1 with an adaptive tuner 615, according to one example. As mentioned, the activity-aware clock gating technique provides for the CGU 110 to clock gate the switch 105 after the CGU 110 observes the condition to enter sleep mode for N clock cycles. Overall, selecting the value of N is a variable that selects the amount of power savings achieved over the lifespan of an application. In some examples, the CGU 110 includes a configuration register 110*a* that holds the value of N for the preset number of clock cycles to observe for the condition to enter sleep mode. The CGU 110 includes a count register 110*b* that contains the current count of clock cycles T since starting the abort window 205 (i.e., the current count of clock cycles for which the CGU 110 has observed the condition to enter sleep mode). In some examples, the value of N in the configuration register 110*a* and the current count of clock cycles in the count register can be software accessible. In some examples, a software program can tune the threshold number of clock cycles N based on application profiling. Using application profiling to tune the threshold number of clock cycles N can increase power savings while reducing the number of times the wake-up latency is experienced. For example, if the past few current count values T are much higher than N, the software can decide to reprogram N to N/2 or less. Accordingly, a lower N causes the CGU 110 to clock gate more aggressively and increase power savings. If the past few current count values T are closer to the value of N, the CGU 110 clock gates the switch 105 for shorter periods of times and thus experiences more latency penalties. Accordingly, the software can decide to reprogram N to 2N or greater. Making diagnostic data of N and T available to software allows more complex power savings algorithms.

As illustrated in FIG. 6, the activity-aware clock gating techniques can include an adaptive tuner 615 to adaptively tune the value of N based on recent history of sleep time. This tuner 615 interfaces with the CGU 110 and reads the value stored in the count register. In some examples, the count register can store the sleep time of the switch 105 (i.e., the number of clock cycles the switch 105 has been clock gated). Based on the recent history of sleep time and the current value in the count register, the tuner can update the value of N dynamically. The tuner 615 can implement a tuning algorithm in hardware or in software, and such tuning algorithm can decrease N when the current value in the count register is greater than or equal to the value N using a logic shifter until the current value in the count register is less than or equal to the value N. In some examples, the tuner 615 can also have storage to remember the past R values of N and can average these values of N for the next application. The value of R can be user-configured or determined by the tuner 615. Accordingly, the power savings by the CGU 110 can be enhanced by the tuner 615 with more complex tuning algorithms at the hardware level.

Figure 7:
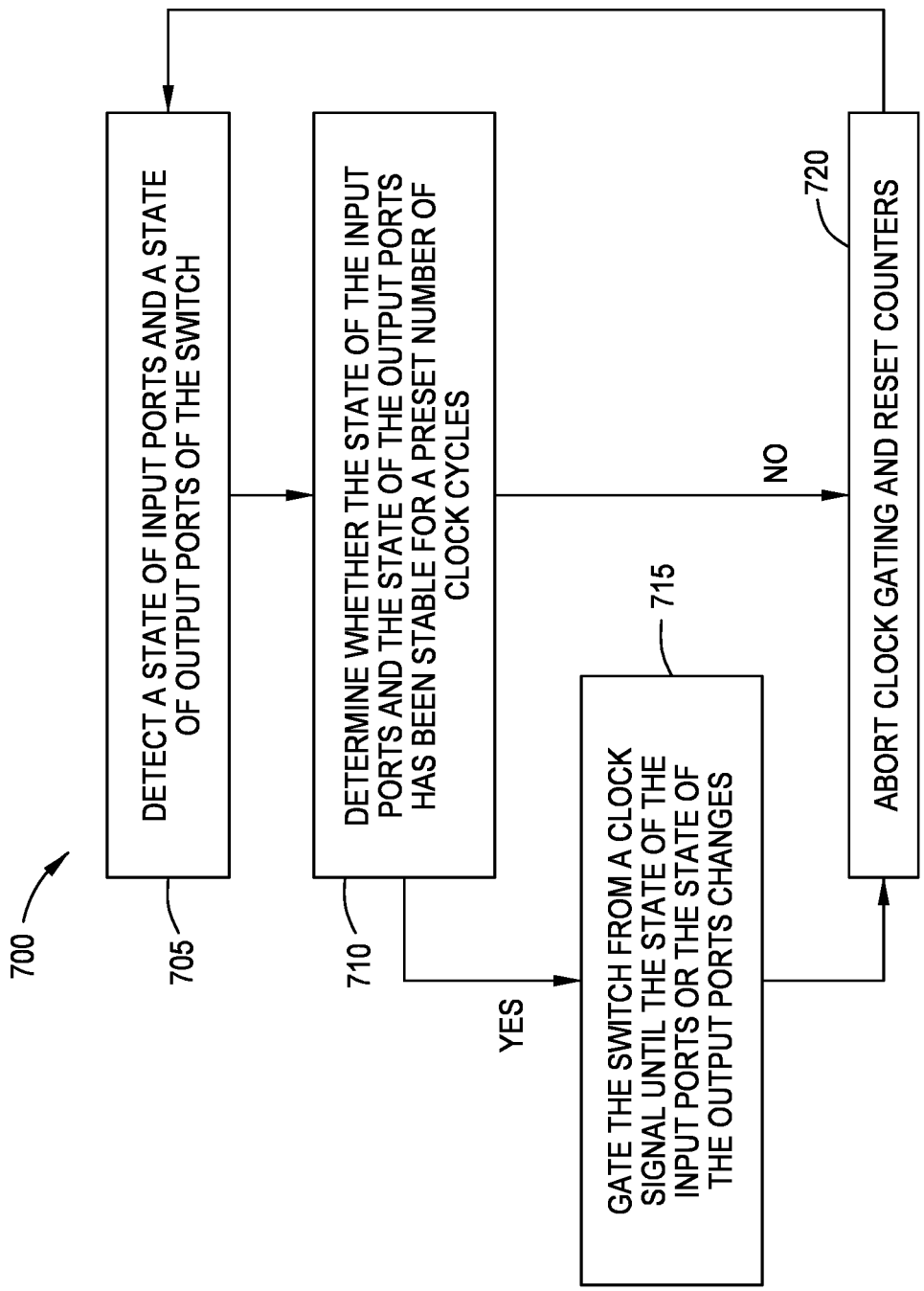
FIG. 7 is a flow diagram illustrating operations by the CGU, according to one example.

FIG. 7 is a flow diagram illustrating operations of a method 700 for clock-gating a switch 105 by the CGU 110 of FIG. 1, according to one example.

At operation 705, the CGU 110 detects a state of input ports 120 and a state of output ports 125 of the switch 105. In some examples, the CGU 110 detects a state of the configuration bus 130 of the switch 105.

At operation 710, the CGU 110 determines whether the state of the input ports 120 and the state of the output ports 125 has been stable for a preset number of clock cycles. Determining whether the states of the input ports 120 and the output ports 125 has been stable for a preset number of clock cycles involves monitoring the states of the input ports 120 and the output ports 125 to ensure that the respective states have been changed between clock cycles. In some examples, the CGU 110 also determines whether the state of the configuration bus 130 has been stable for the preset number of clock cycles.

If the CGU 110 determines the states of the input ports 120 and the output ports 125 has been stable for a preset number of clock cycles, the CGU 110 at operation 715 gates the switch 105 from a clock signal until the state of the input ports 120 or the state of the output ports 125 changes. Similarly, if the CGU 110 determines that the state of the configuration bus 130 has been stable for the preset number of clock cycles, the CGU 110 can clock gate the switch 105. The CGU 110 clock gates the switch 105 until the state of the input ports 120 and/or the state of the output ports 125 changes. Similarly, the CGU 110 clock gates the switch 105 until any of the states of the input ports 120, output ports 125, or configuration bus 130 change.

If the CGU 110 determines the state of the input ports 120 and/or the state of output ports 125 has not been stable for the preset number of clock cycles or if the CGU 110 detects the state of the input ports 120 or the output ports 125 has changed, the CGU 110 at operation 725 aborts the clock-gating of the switch 105 and resets counters used for counting the number of clock cycles for the condition for entering sleep mode. After resetting the counters, the CGU 110 can restart monitoring the switch 105 for the condition to enter sleep mode.

The various examples described herein may employ various computer-implemented operations involving data stored in computer systems. For example, these operations may require physical manipulation of physical quantities usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more examples may be implemented as useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

One or more examples may be implemented as one or more computer programs or as one or more computer program modules embodied in one or more computer readable media. The term computer readable medium refers to any data storage device that can store data which can thereafter be input to a computer system computer readable media may be based on any existing or subsequently developed technology for embodying computer programs in a manner that enables them to be read by a computer. Examples of a computer readable medium (e.g., a non-transitory storage medium) include a hard drive, a Solid State Disk (SSD), network attached storage (NAS), read-only memory, random-access memory (e.g., a flash memory device), a CD (Compact Discs), CD-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

While the foregoing is directed to specific examples, other and further examples may be devised without departing from the basic scope thereof, and the scope thereof is determined by the claims that follow.

What is claimed is:

1. An integrated circuit, comprising:
   a switch circuit comprising one or more input ports and one or more output ports; and
   a clock-gating circuit coupled to the one or more input ports and to the one or more output ports, wherein the clock-gating circuit is configured to:
   detect a state of the one or more input ports and a state of the one or more output ports of the switch circuit;
   determine whether the state of the one or more input ports and the state of the one or more output ports have been stable for a preset number of clock cycles; and
   upon determining the states have been stable for the preset number of clock cycles, gate the switch circuit from a clock signal until the state of the one or more input ports or the state of the one or more output ports changes.

2. The integrated circuit of claim 1, wherein the clock-gating circuit configured to determine whether the state of the one or more input ports and the state of the one or more output ports have been stable for a preset number of clock cycles comprises one of:
   the clock-gating circuit configured to determine whether each valid indicator for the one or more output ports is deasserted; and
   the clock-gating circuit configured to determine whether at least one of a valid indicator and a ready indicator for each of the one or more output ports is deasserted.

3. The integrated circuit of claim 1, further comprising an adaptive tuner circuit coupled to the clock-gating circuit, wherein the adaptive tuner circuit is configured to determine the preset number of clock cycles and store the determined preset number of clock cycles for the clock-gating circuit to use for clock-gating the switch circuit.

4. The integrated circuit of claim 3, wherein the adaptive tuner is configured to determine the preset number of clock cycles based on at least one of:
   application profiling; and
   history of clock gating for the switch circuit.

5. The integrated circuit of claim 1, wherein the clock-gating circuit further comprises:
   a configuration register configured to store the preset number of clock cycles; and
   a count register that includes a number of clock cycles.

6. The integrated circuit of claim 1, wherein the clock-gating circuit configured to determine whether the state of the one or more input ports and the state of the one or more output ports have been stable for a preset number of clock cycles comprises one of:

the clock-gating circuit configured to determine whether each valid indicator for the one or more input ports is deasserted; and the clock-gating circuit configured to determine whether at least one of a valid indicator and a ready indicator for each of the one or more input ports is deasserted.

7. The integrated circuit of claim 1, wherein the clock-gating circuit is further configured to:

detect a state of a configuration bus coupled to the switch circuit;

determine whether the state of the configuration bus has been stable for the preset number of clock cycles; and upon determining the state of the configuration bus has been stable for the preset number of clock cycles, gate the switch circuit from the clock signal until the state of the configuration bus changes.

8. The integrated circuit of claim 7, wherein the clock-gating circuit configured to determine whether the state of the configuration bus has been stable for the preset number of clock cycles comprises the clock-gating circuit configured to determine whether a valid indicator for the configuration bus is deasserted.

9. The integrated circuit of claim 1, wherein the clock-gating circuit is configured to abort clock gating in a same clock cycle when the state of the one or more input ports or the state of the one or more output port changes.

10. The integrated circuit of claim 1, wherein the clock-gating circuit is configured to reset a counter of clock cycles when the state of the one or more input ports or the state of the one or more output ports changes before the counter of clock cycles reaches the preset number of clock cycles.

11. A method of clock gating a switch circuit in an integrated circuit, the method comprising:

detecting a state of one or more input ports and a state of one or more output ports of the switch circuit;

determining whether the state of the one or more input ports and the state of the one or more output ports have been stable for a preset number of clock cycles; and upon determining the states have been stable for the preset number of clock cycles, gating the switch circuit from a clock signal until the state of the one or more input ports or the state of the one or more output ports changes.

12. The method of claim 11, further comprising:

detecting a state of a configuration bus coupled to the switch circuit;

determining that the state of the configuration bus has been stable for the preset number of clock cycles before gating the switch circuit from the clock signal; and wherein gating the switch circuit from the clock signal comprises gating the switch circuit from the clock signal until the state of the configuration bus changes.

13. The method of claim 12, wherein determining that the state of the configuration bus has been stable for the preset number of clock cycles before gating the switch circuit from the clock signal comprises determining whether a valid indicator for the configuration bus is deasserted.

14. The method of claim 11, wherein an adaptive tuner circuit configures—the preset number of clock cycles.

15. The method of claim 11, wherein determining whether the state of the one or more input ports and the state of the one or more output ports have been stable for a preset number of clock cycles comprises one of:

determining whether each valid indicator for the one or more input ports is deasserted; and determining whether at least one of a valid indicator and a ready indicator for each of the one or more input ports is deasserted.

16. The method of claim 11, wherein determining whether the state of the one or more input ports and the state of the one or more output ports have been stable for a preset number of clock cycles comprises one of:

determining whether each valid indicator for the one or more output ports is deasserted; and determining whether at least one of a valid indicator and a ready indicator for each of the one or more output ports is deasserted.

17. The method of claim 11, wherein the preset number of clock cycles is user-configured.

18. The method of claim 11, further comprising aborting clock gating in a same clock cycle when the state of the one or more input ports or the state of the one or more output ports changes.

19. The method of claim 11, wherein determining whether the state of the one or more input ports and the state of the one or more output ports have been stable for a preset number of clock cycles comprises incrementing a number of clock cycles in a count register, wherein the number of clock cycles indicates a number of clock cycles during which the state of the one or more input ports and the state of the one or more output ports have been stable.

20. The method of claim 19, further comprising:

resetting a counter of clock cycles when the state of the one or more input ports or the state of the one or more output ports changes before the number of clock cycles reaches the preset number of clock cycles.

* * * * *